United States Patent
Brady et al.

(10) Patent No.: US 6,246,095 B1
(45) Date of Patent: Jun. 12, 2001

(54) SYSTEM AND METHOD FOR FORMING A UNIFORM THIN GATE OXIDE LAYER

(75) Inventors: David C. Brady, Windermere; Yi Ma; Pradip K. Roy, both of Orlando, all of FL (US)

(73) Assignee: Agere Systems Guardian Corp., Miami Lakes, FL (US)

( * ) Notice: Subject to any disclaimer, the term of this patent is extended or adjusted under 35 U.S.C. 154(b) by 0 days.

(21) Appl. No.: 09/146,418

(22) Filed: Sep. 3, 1998

Related U.S. Application Data

(62) Division of application No. 08/814,670, filed on Mar. 11, 1997, now Pat. No. 5,940,736.

(51) Int. Cl.$^7$ ................................................. H01L 29/76
(52) U.S. Cl. ......................... 257/411; 257/635; 257/639
(58) Field of Search ................................... 257/411, 635, 257/639, 640

(56) References Cited

U.S. PATENT DOCUMENTS

| | | | |
|---|---|---|---|
| 4,851,370 | 7/1989 | Doklan et al. | 437/225 |
| 5,153,701 | * 10/1992 | Roy | 357/54 |
| 5,712,208 | 1/1998 | Tseng et al. | 438/770 |

OTHER PUBLICATIONS

Article from the AT&T Technical Journal: Nov./Dec. 1988 entitled "Synthesis of High–Quality Ultra–Thin Gate Oxides for ULSI Applications" by Pradip K. Roy and Ashok K. Sinha: pp. 155–174.

Article from Semiconductor International: Jul. 1992 entitled "A Robust Gate Dielectric for Submicron Technology" by Hsing–Huang Tseng and Philip J. Tobin: pp. 68–74.

\* cited by examiner

*Primary Examiner*—Sara Crane

(57) ABSTRACT

This invention includes a novel synthesis of a three-step process of growing, depositing and growing $SiO_2$ under low pressure, e.g., 0.2–10 Torr, to generate high quality, robust and reliable gate oxides for sub 0.5 micron technologies. The first layer, 1.0–3.0 nm is thermally grown for passivation of the Si-semiconductor surface. The second deposited layer 1.0–5.0 nm forms an interface with the first grown layer. During the third step of the synthesis densification of the deposited oxide layers occurs with a simultaneous removal of the interface traps at the interface and growth of a stress-modulated $SiO_2$ occurs at the Si/first grown layer interface in the presence of a stress-accommodating interface layer resulting in a planar and stress-reduced $Si/SiO_2$ interface. The entire synthesis is done under low-pressure (e.g., 0.2–10 Torr) for slowing down the oxidation kinetics to achieve ultrathin sublayers and may be done in a single low-pressure furnace by clustering all three steps. For light nitrogen-incorporation (<5%) for certain devices, often required due to improved resistance to boron and other dopant diffusion and hot-carrier characteristics, $N_2O$ or NO in the oxidant are used during each steps of the stacked oxide synthesis. Planar and stress-reduced $Si/SiO_2$ interface characteristics is a unique signature of stacked oxide that improves robustness of the gate oxide to ULSI processing resulting in reduced scatter in device parameters (e.g., threshold voltage transconductance), mobility degradation and resistance to hot-carrier and Fowler-Nordheim stress.

13 Claims, 1 Drawing Sheet

SYSTEM AND METHOD FOR FORMING A UNIFORM THIN GATE OXIDE LAYER

This application is a divisional of prior application Ser. No. 08/814,670, filed on Mar. 11, 1997, now U.S. Pat. No. 5,940,736, to David C. Brady.

TECHNICAL FIELD OF THE INVENTION

The present invention is directed, in general, to integrated circuit fabrication and, more specifically, to a system and method for forming a uniform, ultrathin gate oxide layer on a semiconductor substrate.

BACKGROUND OF THE INVENTION

As metal-oxide-semiconductor ("MOS") technology continues to advance and the features of the MOS devices shrink, a scaling down in the vertical dimension of the devices typically occurs. Critical to the success of these devices is a reliable, high-quality gate dielectric with a low defect density ("$D_o$") and a high breakdown field strength ("$F_{bd}$") that retains its quality during advanced processing. As the overall size of the semiconductors get ultrathin (e.g., less than 7.5 nm), the quality of the oxide (e.g., $SiO_2$), even under the best possible external growth conditions, is limited by the natural viscoelastic compressive stress generated in the $SiO_2$ at temperatures below 1000° C. and by the thermal expansion mismatch between silicon substrate and $SiO_2$. In present applications, a genuine lowering of the $D_o$ in the range of 0.05 to 0.5 cm$^{-2}$ has been achieved. For example, oxide/nitride or oxide/nitride/oxide (ONO) structures can attain such low $D_o$. The $Si_3N_4$—$SiO_2$ ("silicon nitride-silicon oxides") interface, however, is invariably associated with a high density of interface states ("$Q_{it}$") that cannot be annealed out easily because the $Si_3N_4$ layer is impervious to diffusion of oxidizing species. These multi-layered dielectrics are unsuitable as gate dielectrics in advanced complementary metal-oxide-semiconductor ("CMOS") integrated circuits, because the interface states can cause charge-induced shift in the threshold voltage and can reduce the channel conductance during operation.

To overcome this problem, the concept of stacking thermally grown and chemical-vapor-deposited ("CVD") $SiO_2$ structures has been proposed in U.S. Pat. No. 4,851,370 ("the '370 patent"), which is incorporated herein by reference for all purposes. Here, the composite stack is synthesized by a 3-step grow-deposit-grow technique wherein the growing steps are conducted at pressures equal to or greater than one atmosphere. The interface between the grown and deposited $SiO_2$ layers serves the same purpose as the interface in $SiO_2$—$Si_3N_4$ structures (i.e., it reduces the$_o$ D by misaligning the defects across the interface). Moreover, the interface traps in stacked oxide structures that can be removed easily by an oxidizing anneal, since the top deposited $SiO_2$ layer, unlike the $Si_3N_4$ film, is transparent to oxidizing species (i.e., it transports them by diffusion). This stacking concept can be applied to any composite dielectric structure with similar results as long as the top deposited dielectric layer is transparent to the oxidizing species.

A few major factors contributing to defects in conventional thin-oxide gate dielectrics are growth-induced micropores and intrinsic stress within the oxide layer. The micropores are 1.0 nm to 2.5 nm in diameter, with an average separation of about 10.0 nm. The pores form at energetically favored sites such as heterogeneities created by localized contaminants, ion-damaged areas, dislocation pile-ups and other defect areas on the silicon-surface resulting from retarded oxidation in these sites. The pores grow outward as oxidation continues to consume silicon around the pore. Thus, a network of micropores usually exists in $SiO_2$. The micropore network forms potential short-circuit paths for diffusional mass transport and for current leakage.

In addition, the stress within a $SiO_2$ layer, often accentuated by complex device geometries and processing, usually increases both the size and density of the micropores. Therefore, in developing thin dielectrics with ultra-low $D_o$, not only should the initial $D_o$ be reduced, but also the local stress-gradients near the Si—$SiO_2$ interface should be reduced by providing a stress-accommodating layer, such as an interface (between grown and deposited layers) within the dielectric that acts as a stress cushion and defect sink.

The above-mentioned problems become even more acute as the overall size of devices decrease to sub-micron size with ultrathin gate dielectrics (e.g., less than 7.5 nm). Unfortunately, however, the above-discussed conventional stacked-oxide process, which works extremely well in technologies where the semiconductor thickness is greater than 7.5 nm, is not as applicable in technologies having thicknesses less than 7.5 nm. The main reason for this is that in the conventional 3-step stacked process, the $SiO_2$ is grown in pressures of one atmosphere or greater. In semiconductor technologies where the gate oxide thickness is 10.0 nm or greater, this particular condition is most advantageous because under such atmospheric pressure, the $SiO_2$ can be grown quite rapidly and one can grow the first grown layer (typically 3.5–7.5 nm) with good uniformity. This rapid growth is highly desirable, f or it cuts down in manufacturing time, and thus, overall production costs. This same rapid growth, which is so advantageous in technologies with gate oxide thickness of 10.0 nm or greater is less desirable in sub-0.5 micron semiconductor technologies because the oxides grow too quickly, which makes thicknesses harder to control. As such, the oxide layers are less uniform in thickness, which is unacceptable.

Accordingly, what is needed in the art is a stacked-oxide process that provides semiconductors having thicknesses of less than 10.0 nm and, more advantageously less than 7.5 nm, and yet provides a semiconductor that has a low defect density ("$D_o$") and a high breakdown field strength ("$F_{bd}$") that retains its quality during advanced processing. The present invention addresses this need.

SUMMARY OF THE INVENTION

To address the above-discussed deficiencies of the prior art, the present invention provides a semiconductor and systems and methods of manufacture thereof. One method includes the following grow-deposit-grow steps: (1) growing a first oxide layer on the semiconductor substrate in a zone of low pressure, (2) depositing a dielectric layer on the first oxide layer in the zone of low pressure and (3) growing a second oxide layer between the first oxide layer and the substrate in the zone of low pressure. The zone of low pressure is created to retard the oxidation rate at which the first and second oxide layers are grown.

The present invention therefore introduces the broad concept of growing the first and second oxide layers under low pressure oxidizing conditions to retard their growth. Such retardation of the growth rate is necessary given the thinness and uniformity desired in the dielectric sub-layers in sub-micron technologies.

In one embodiment of the present invention, the second grown oxide layer may have a thickness of less than 10 nm or between about 0.5 nm and about 0.8 nm and may be grown at a temperature exceeding 800° C.

In one embodiment of the present invention, the steps of growing, depositing and growing are performed in a single vapor deposition equipment. That the method of the present invention may be performed in a single "tool" or "furnace" allows high rates of production and greater process control, although, performance in a single tool is not required.

In one embodiment of the present invention, a pressure in the zone of low pressure ranges from about 200 milliTorr to about 950 milliTorr. In a more specific embodiment, the pressure is about 900 milliTorr during the step of growing the first and second oxide layers and about 400 milliTorr during the second step of depositing the dielectric layer.

In one embodiment of the present invention, a thickness of the first grown oxide layer is less than about 5.0 nm. In a more specific embodiment of the present invention, however, the thickness is about 3.0 nm.

In another embodiment of the present invention, the deposited dielectric layer is generated from the decomposition of tetraethyl orthosilicate ("TEOS") and has a thickness of about 1.5 nm. In a more specific embodiment of the present invention, the thickness ranges from about 1 nm to about 4.0 nm. The TEOS is preferably deposited at a flow rate of 50 cubic centimeters per minute.

In one embodiment of the present invention, the steps of growing and depositing are performed at a temperature that ranges from about 600° C. to about 750° C. In yet another embodiment, the step of growing the second oxide layer is performed at a temperature ranging from about 800° C. to about 1000° C.

In one embodiment of the present invention, the step of growing the first oxide layer is performed under a pressure of 900 milliTorr and the oxygen has a flow rate of 9 standard liters per minute. In yet another embodiment, the step of growing is performed under a nitrous oxide and nitrogen environment wherein the nitrous oxide has a flow rate of about 1.72 standard liters per minute and the nitrogen has a flow rate of about 0.75 standard liters per minute to attain light-nitridation, (1–5%) near the interface between the first and second grown oxide layers.

In another aspect of the present invention, a semiconductor comprised of a substrate and having a stress-accommodating layer formed therein is provided. The semiconductor has a thickness less than 7.5 nm and comprises: (1) a first grown oxide layer on the substrate that was formed on an exposed surface of the substrate in a zone of low pressure, (2) a deposited dielectric layer on the first grown oxide layer that was formed over the first grown oxide layer in the zone of low pressure and (3) a second grown oxide layer formed between the first oxide layer and the substrate that was formed in the zone of low pressure. The zone of low pressure is created to retard a rate at which the first and second oxide layers are grown. During this third-step of stacked oxide synthesis oxide growth occurs under a stress-modulating condition provided by the interface between the first grown and second deposited layer generating a planar and stress-free substrate Si/SiO$_2$ interface which can otherwise never be achieved by conventional 1-step oxide growth.

In one embodiment of this aspect of the present invention, the first grown oxide, the second deposited dielectric and the second grown oxide layers are formed on the substrate in a single low-pressure vapor deposition equipment. As previously stated, this offers the advantage of decrease production cycle time and thus production cost.

In one embodiment of this aspect of the present invention, the second grown oxide layer may be formed at a temperature exceeding about 800° C., and the first oxide layer and the dielectric layer may be grown in a temperature exceeding about 600° C. In one embodiment, the second grown oxide layer may have a thickness of less than 1 nm. The second grown oxide layer may have thickness that ranges from about 0.5 nm to about 0.8 nm.

In one embodiment of this aspect of the present invention, the deposited dielectric layer is formed in a pressure of about 400 milliTorr in the zone of low pressure and may have a thickness of about 10.5 nm. In yet another aspect of this particular embodiment, the deposited dielectric layer is formed from the decomposition of TEOS, which preferably had a flow rate of 50 cubic centimeters per minute during its deposition.

In one embodiment of this aspect of the present invention, the first oxide layer may have a thickness of less than about 5.0 nm (preferably in the range of 1.0 nm to 3.0 nm).

The foregoing has outlined, rather broadly, preferred and alternative features of the present invention so that those skilled in the art may better understand the detailed description of the invention that follows. Additional features of the invention will be described hereinafter that form the subject of the claims of the invention. Those skilled in the art should appreciate that they can readily use the disclosed conception and specific embodiment as a basis for designing or modifying other structures for carrying out the same purposes of the present invention. Those skilled in the art should also realize that such equivalent constructions do not depart from the spirit and scope of the invention in its broadest form.

BRIEF DESCRIPTION OF THE DRAWINGS

For a more complete understanding of the present invention, reference is now made to the following descriptions taken in conjunction with the accompanying drawings, in which.

DETAILED DESCRIPTION

Figure 1:
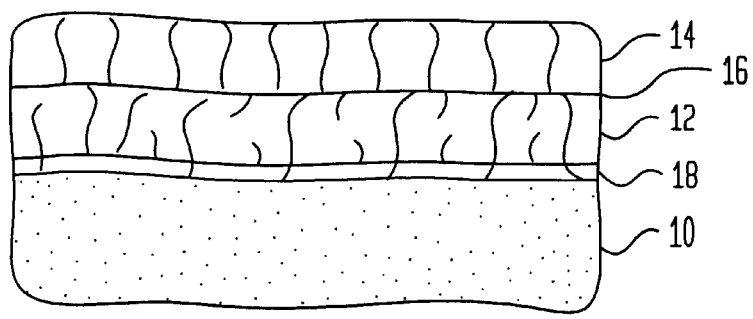
FIG. 1 illustrates a schematic representation of a structure according to an advantageous embodiment of the present invention.

Referring initially to FIG. 1, there is illustrated a schematic representation of a structure according to an advantageous embodiment of the present invention. In one such embodiment, a substrate 10 is used, and a 1 nm to 2.5 nm oxide layer 12 is formed on the substrate under a low pressure, for example, a pressure of less than 10 Torr. In more advantageous embodiments, the pressures are at less than about 2 Torr. In one advantageous embodiment, the substrate 10 may be silicon and the oxide layer 12 may be silicon dioxide (SiO$_2$) that is thermally grown from the substrate 10 to a thickness that may range from about 1 nm to about 2.5 nm. However, it will be appreciated by those skilled in the art that other materials presently used in the manufacturer of semiconductor devices may be used or materials later-determined to be useful for such manufacture may also be used. Moreover, it is within the scope of the present invention that the oxide layer 12 could also be deposited, as long as it has a different defect structure compared to the second deposited layer. However, as just mentioned above, it is desirable that the oxide layer 12 be thermally grown. Depending on the particular embodiment, the low pressure under which the oxide layer 12 is grown may range from about 0.4 Torr to about 10 Torr and the temperature may range from about 350° C. to about 1000° C. In one embodiment, the oxygen flow may be at a rate that ranges from about 5 standard liters per minute (slm) to about 25 slm. However, in an advantageous embodiment, the pressure under which the oxide layer 12 is grown under a pressure of about 900 milliTorr and the temperature may range from about 600° C. to about 750° C.

Forming the oxide layer 12 under low pressure is a radical departure from the conventional stacked oxide synthesis, in which the oxide layer is grown under a pressure of one atmosphere or greater. In conventional stacked oxides, pressures of one atmosphere or greater were necessary to grow the first oxide layer because the substrate and oxide layers had an overall thickness of 10.0 nm or greater. As such, higher pressures were very desirable to rapidly grow the first and second oxide layers to minimize production cycle time without sacrificing oxide-uniformity and quality. In the present invention, however, such rapid growth is no longer desirable because the overall thickness of today's semiconductors has decreased to ultrathin size, i.e., less than about 7.5 nm. Furthermore, it has been surprisingly found that growing the oxide layer 12 under low pressure, typically 1.0 nm-2.5 nm, does not adversely affect the electrical or physical properties of the semiconductor. To the contrary, because of the low pressure grow-deposit-grow scheme provided by the present invention, the physical and electrical properties, as well as the overall quality, of the semiconductors manufactured in accordance with the present invention, are believed to be equal to those manufactured under the conventional stacked oxide synthesis discussed in the incorporated '370 patent. Furthermore, ultrathin, uniform oxide layers are now possible in a single furnace cluster step as provided by the present invention.

Under conventional processes, the oxide layer grows rapidly, making it extremely difficult to achieve a uniform, high quality ultrathin semiconductor that has an overall thickness of less than about 7.5 nm. Moreover, the conventional grow-deposit-grow process were conducted in three different furnaces; two furnaces in which the pressure was kept at atmospheric pressure or greater to grow the thicker oxides and a third in which the pressure was subatmospheric to deposit the dielectric. In application of this conventional grow-deposit-grow process, the semiconductor was first placed in an atmospheric furnace, then transferred to a low pressure furnace and then transferred back to an atmospheric furnace. As well imagined, this three separate furnace operation increased cycle time and reduced throughput, which increased the overall cost of the semiconductor device.

In contrast, however, the present invention provides a process that allows the oxide layer 12 to be formed in a controlled manner to thicknesses well below the 3.0 nm required by today's sub-micron (e.g., 0.25 microns) technologies, which are particularly useful in CMOS and BiCMOS technologies and their enhancement modules. While, the controlled growth is somewhat dependent on the pressures at which the oxide is formed, flow concentration and growth temperatures also play a part in the oxide growth. Furthermore, the grow-deposit-grow scheme of the present invention can be conducted in a single low pressure cluster furnace since the oxide layer 12 can be formed under the same low pressure environment under which a dielectric layer is deposited. The controlled growth of the oxide layer 12 provides a semiconductor having a ultrathin, yet high quality and very uniform thickness, which is highly-desirable in ultrathin stacked oxide gate formation.

Also shown in FIG. 1 is the dielectric layer 14 formed over the oxide layer 12. This deposited oxide layer is, preferably an oxygen permeable film that is transparent to $O_2$ species, and more preferably is silicon oxide ($SiO_2$). In one advantageous embodiment, the dielectric layer 14 is deposited by the low pressure chemical vapor deposition decomposition of tetraethyl orthosilicate ("TEOS") or the oxidation of silane $SiH_4$ in the presence of oxygen or nitrous oxide ($N_2O$). The flow rate of material, which may be TEOS, may range from about 10 to about 100 cc/min, with the flow rate of the $O_2$ or the $N_2O$ ranging from about 0.5 slm to about 5 slm. These conditions combine to form a preferred deposition rate of the dielectric layer of that may range from about 0.01 nm to about 10.0 nm per minute. The interface between these layers 12 and 14 is shown by the horizontal line 16. The deposition temperatures for the dielectric layer 14 may be in the same range as those stated above for the first grown oxide layer 12. An exemplary pressure under which the dielectric layer 14 is deposited is about 400 milliTorr.

For reasons that are discussed below, not all combinations of dielectric materials are useful because the deposited dielectric 14 must have different defect structures from layer 12 to form the interface 16 and also 14 must be transparent to oxidizing species to anneal out the traps during the second growing step. For example, although the well known $SiO_2$—$Si_3N_4$ structure has a low defect density, it also has a high density of traps that cannot be reduced by annealing. This structure is, therefore, not useful in the present invention, unless the nitride layer is completely consumed to form silicon oxynitride to make the layer semitransparent to oxidizing species. However, the thermally grown/deposited oxide structure of the present invention provides a low defect density as well as a deposited layer 14 that is transparent to oxidant ambient and therefore, traps can be removed by annealing.

Continuing to refer to FIG. 1, there is also illustrated a second grown oxide layer 18 formed between the substrate 10 and the oxide layer 12 during the third-step of synthesis. In preferred embodiments, this third oxide layer 18 is also thermally grown. The manufacturing temperature used to grow the oxide layer 12 and deposit the dielectric layer 14 is increased from about 650° C. to between about 800° C.–1000° C. These temperatures provide a densification/annealing oxidizing step which, as the term suggests, both densifies the existing oxide and deposited oxide dielectric layer 14. In addition, the new oxide layer 18 is grown under stress-modulated conditions provided by the interface 16, resulting in a planar and stress-free substrate/oxide (18) interface that is critical to device performance and reliability. In an advantageous embodiment, this anneal is conducted at a temperature that may range from about 800° C. to about 1000° C. and a pressure that may range from about 0.4 Torr to about 10 Torr, with a preferred pressure during this phase being 900 milliTorr. More preferably, the temperature is held at about 850° C. for approximately one hour. The growing oxidizing environment is a mixture of oxygen and nitrogen or nitrous oxide and nitrogen. The oxygen or nitrous oxide may have flow rates that range from about 0.5 slm to about 25 slm. In an exemplary embodiment, this procedure produces an oxide layer with a thickness ranging from about 0.5 nm to about 0.8 nm. The thermally grown second grown oxide layer 18 forms a planar and stress-free interface between the substrate 10 and the oxide layer 18 as it is grown under controlled stress modulation provided by the stress-accommodating interface 16 layer. The planar substrate/dielectric interface has desirable interfacial and electrical properties. Furthermore, the formation of the second grown oxide layer 18 provides an Si/SiO$_2$ interface with minimum roughness and stress gradient, both of which are highly desirable in sub-micron technologies for device performance and reliability.

During annealing, oxide growth occurs as the oxidizing species diffuses through the existing oxide and then reacts with silicon at the Si/SiO$_2$ interface. It has been found that the presence of defect within the oxides enhances the transport of the oxidant by diffusion; that is, the defects provide paths for the oxidant. The newly grown SiO$_2$ is structurally superior than any other oxides because the growth occurs under the stress accommodating conditions provided by the interface 16, which acts as a stress cushion. The interface 16 also acts as a defect sink and as a barrier for the diffusional transport of contaminant ions from the ambient environment to the Si/SiO$_2$ interface. The oxidation reaction during the densification anneal third step produces a reduction in the number of interface traps together with a simultaneous reduction in the Si/SiO$_2$ interface stress gradient, and roughness.

In contrast, in a conventional Si$_3$N$_4$/SiO$_2$ structure Si$_3$N$_4$ is opaque to the diffusion of the oxidant. During the oxidizing anneal, the top of the Si$_3$N$_4$ oxidizes to form silicon oxynitride without any oxidant transport to the interface. Thus, the density of interface states remains unchanged after an oxidizing anneal. Moreover, because the Si$_3$N$_4$ layer is relatively impervious to the diffusional transport of the oxidizing species, there is very little reduction in the interfacial roughness and number of asperities as there is no interfacial oxidation reaction during the densification anneal.

This concept of stacking can be achieved through variations of the composition of the materials that form the oxidized dielectric layers and the way in which they are formed. For example, onto the grown SiO$_2$ layer a polysilicon layer may be deposited and oxidized or a thin nitride layer may be completely oxidized to deposit layer 14. Other variations will be readily apparent by those skilled in the art.

As illustrated in FIG. 1, each layer has a plurality of defects, i.e, first grown and second deposited SiO$_2$ layers have different defect structures, which are schematically represented by the substantially vertical wavy lines. The defects are misaligned with respect to each other, that is, the defects within each layer terminate at the interface of grown oxide layer 12 and deposited dielectric layer 14. Defects for amorphous SiO$_2$ structures may be micropores, sudden change of local order, boundaries, etc. As understood from the incorporated '370 patent, misaligning defects across the interface reduces the defect density (D$_o$) For thin oxide gate dielectrics, the major contributors to D$_o$ are the growth induced defect density and the intrinsic stress within the oxide-layer. Defects form at energetically favored sites such as heterogeneities formed by localized contaminants, ion damaged areas and faulting on silicon nucleation surface because of retarded oxidation. The defects grow outward as oxidation consumes silicon around the defect and eventually a network of defects exists. The defects may be viewed as pipes for diffusional mass transport as well as potential current paths, which would have substantial impact on device performance and reliability. The misalignment of these defects, which is a direct result of the low pressure grow-deposit-grow scheme, greatly reduces the D$_o$ and thereby provides a high quality gate oxide.

With respect to density defects, it is known that stress incorporation in SiO$_2$ films is due to incomplete relaxation of the viscoelastic compressive stress at oxidation temperatures less than 900° C., and the thermal expansion mismatch between SiO$_2$ and Si. Moreover, complex device geometry and processing frequently results in locally high stress level that induce the generation and propagation of defects thereby increasing both the size and density of defects. The interface made between two different dielectrics, such as two types of oxides, e.g., the thermally grown oxide layer 12 and the layer 14 and deposited oxide described with respect to FIG. 1. The interface effectively reduces the defect density by providing a discontinuity in the defect structure. The interface is not effective in reducing the effective defect density if the defects in the two dielectrics are aligned, i.e., if they are not misaligned and there is no discontinuity. Thus, it is highly advantageous that the defects be misaligned as in the present invention.

Figure 2:
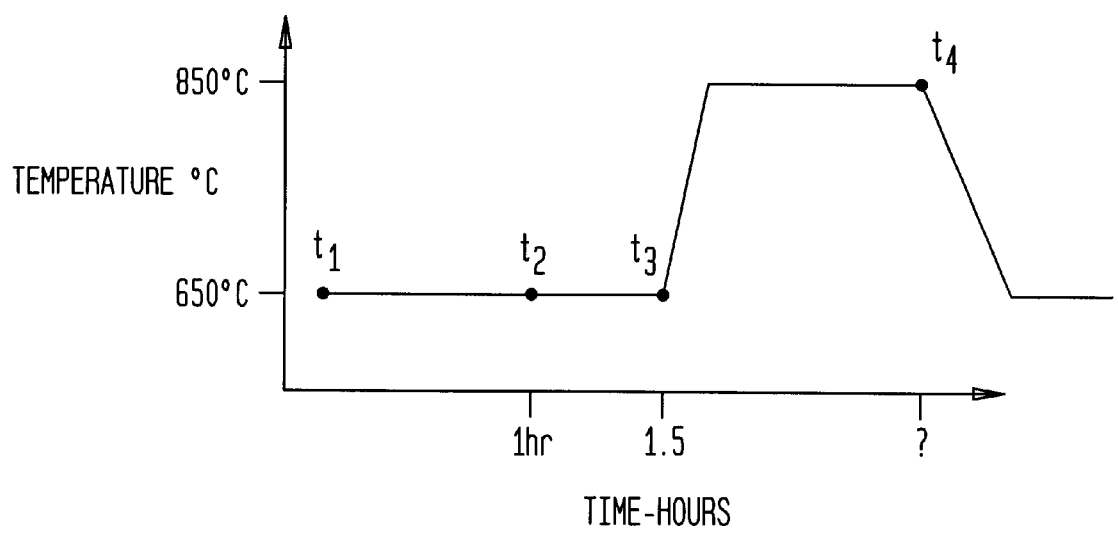
FIG. 2 illustrates a schematic graph of the thermal, pressure and flow rate history for an oxidation scheme in accordance with an advantageous embodiment of the present invention.

Turning now to FIG. 2, an advantageous embodiment of the generalized thermal schedule and gas flow sequence of the formation of the oxide layers will now be described, keeping in mind that exemplary broader ranges have been previously discussed. Time is plotted horizontally and temperature is plotted vertically. Both scales are in arbitrary units. The oxidation cycle begins with the growth of the first oxide layer 12 at $t_1$ with the insertion of the pre-gate cleaned silicon wafers under an atmosphere of O$_2$ at a temperature of about 650° C. into a low pressure furnace. The O$_2$ is preferably flowed over the silicon substrates at a rate that ranges from about 5 slm to about 25 slm. In a more advantageous embodiment, the flow rate is 9 slm. The pressure is maintained at 900 milliTorr, and the semiconductor (Si) is left under these conditions for about 1 hour to grow an oxide layer having a thickness of about 3.0 nm. At time $t_2$ The dielectric layer 14 is then formed by discontinuing the flow Of O$_2$ and commencing a flow of N$_2$O at the rate of 1.75 slm and a flow of N$_2$ at the rate of 0.75 slm. The temperature is maintained at 650° C., but the pressure is dropped to about 400 milliTorr. TEOS is introduced into the furnace at the rate of 50 cubic centimeters per minute (cc/min.). The semiconductor is left under these conditions for 0.5 hours to deposit a SiO$_2$ layer with a thickness of about 1.5 nm. At time $t_3$ The densification/annealing oxidizing step is then performed to densify the composite oxide (layers 12 and 14) and to oxidize the substrate 10 and grow the second grown oxide layer 18. To accomplish this step, the temperature is increased to about 850° C., the flow of N$_2$ is discontinued and either a flow of $_2$O or $_2$NO is commenced at a rate of 9 slm under a pressure of 900 milliTorr. This step is continued for about one hour to grow the second grown oxide layer 18 to a thickness of about 0.5 nm to about 0.8 nm. During this step, three events occur: (1) densification of layer 14, (2) removal of interface traps from the interface 16 between layers 12 and 14 and (3) growth of a stress-free oxide layer 18 that generates a planar Si/SiO$_2$ interface. Following this phase of the procedure, the semiconductor is removed from the low pressure furnace at time $t_4$.

From the foregoing, it is readily apparent that the present invention provides a semiconductor and method of manufacturer therefore that includes the steps of: (1) growing a first oxide layer on the semiconductor substrate in a zone of low pressure; (2) depositing a dielectric layer on the first oxide layer in the zone of low pressure; and (3) growing a second oxide layer between the first oxide layer and the substrate in the zone of low pressure. The zone of low pressure is created to retard oxidation rates so that ultrathin stacked oxide with high quality and robustness can be achieved.

The present invention therefore introduces the broad concept of low pressure stacked (grow-deposit-grow) oxide synthesis in a single thermal schedule. Such retardation of the growth rate is necessary, given the thinness and uniformity desired in the oxide sub-layers for sub-micron technologies. The resulting ultrathin stacked $SiO_2$ structure has superior electrical and substructural properties over the conventional oxidation scheme of the prior art. This novel synthesis is achieved through the low pressure growing-depositing-growing of $SiO_2$ layers on silicon substrates by thermal oxidation, low pressure chemical vapor deposition ("LPCVD"), and densification/oxidation, respectively. The resulting stacked oxides have ultra-low defect density with excellent breakdown and interfacial characteristics.

Such low defect density in sub-micron technologies is comparable to that previously believed possible only for dual-dielectric $Si_3N_4$—$SiO_2$ interfaces. Moreover, it is believed that these stacked oxides of the present invention should have better robustness to severe ULSI processing, resistant to hot-carrier aging, mobility degradation, and narrow channel degradation behavior, in addition to the other superior physical and electrical properties as found in the stacked oxide semiconductors provided in the incorporated '307 patent.

Based on the studies conducted and disclosed in the '307 patent, the lowering in defect density, which is an aspect of the present invention, results from misaligning the micropores and other interconnecting defects within the stacked oxide layer and from annihilation of defects during densification/oxidation by the defect sink provided by the interface between the thermally grown and LPCVD-deposited $SiO_2$ layers. The superior Si—$SiO_2$ interfacial characteristics of the stacked oxide are due to the excellent substructure of the $SiO_2$ grown during low pressure densification/oxidation annealing in near-equilibrium conditions in the presence of a stress-accommodating interface layer.

Although the present invention has been described in detail, those skilled in the art should understand that they can make various changes, substitutions and alterations herein without departing from the spirit and scope of the invention in its broadest form.

What is claimed is:

1. A semiconductor device comprising:
   a first low pressure grown oxide layer;
   a dielectric layer located on said first low pressure grown oxide layer;
   a stress-accommodating interface located between said first low pressure grown oxide layer and said dielectric layer; and
   a second low pressure grown oxide layer located between said first low pressure grown oxide layer and said substrate, said second low pressure grown oxide layer having a thickness of less than about 1 nm.

2. The semiconductor as recited in claim 1 wherein said first and second oxide layers and said dielectric layer are formed on said substrate in a single vapor deposition device.

3. The semiconductor as recited in claim 1 wherein said second oxide layer is formed at a temperature exceeding about 800° C.

4. The semiconductor as recited in claim 1 wherein said dielectric layer is formed in a zone of low pressure of about 400 milliTorr.

5. The semiconductor as recited in claim 1 wherein said first oxide layer has thickness of less than about 5.0 nm.

6. The semiconductor as recited in claim 5 wherein said thickness is about 3.0 nm.

7. The semiconductor as recited in claim 1 wherein said dielectric layer comprises an oxidized tetraethyl orthosilicate (TEOS) and has a thickness of about 1.5 nm.

8. The semiconductor as recited in claim 7 wherein said TEOS layer is deposited at a flow rate of about 50 cubic centimeters per minute.

9. The semiconductor as recited in claim 1 wherein a thickness of said second oxide layer ranges from about 1 nm to about 4.0 nm.

10. The semiconductor as recited in claim 1 wherein said first oxide layer and said dielectric layer are grown in a temperature of about 650° C.

11. The semiconductor as recited in claim 1 wherein said first oxide layer is formed under a pressure of 900 milliTorr and an environment of oxygen with a flow rate of 9 standard liters per minute.

12. The semiconductor as recited in claim 1 wherein said dielectric layer is formed under a nitrous oxide and nitrogen environment, wherein a flow rate of said nitrous oxide is about 1.72 standard liters per minute and a flow rate of said nitrogen is about 0.75 standard liters per minute.

13. The semiconductor as recited in claim 1 further including light nitrogen incorporation from about 1% to about 5% near said stress-accommodating interface.

* * * * *